(12) United States Patent
Krames et al.

(10) Patent No.: US 11,879,085 B2
(45) Date of Patent: Jan. 23, 2024

(54) CONVERTER SYSTEM

(71) Applicant: Seaborough IP I B.V., Amsterdam (NL)

(72) Inventors: Michael Krames, Palo Alto, CA (US); Marie Anne Van de Haar, Weesp (NL)

(73) Assignee: SEABOROUGH IP I B.V., Amsterdam (NL)

( * ) Notice: Subject to any disclaimer, the term of this patent is extended or adjusted under 35 U.S.C. 154(b) by 5 days.

(21) Appl. No.: 17/485,665

(22) Filed: Sep. 27, 2021

(65) Prior Publication Data

US 2022/0049159 A1    Feb. 17, 2022

Related U.S. Application Data

(63) Continuation of application No. 16/487,439, filed as application No. PCT/EP2018/056660 on Mar. 16, 2018, now Pat. No. 11,162,026.

(30) Foreign Application Priority Data

Mar. 17, 2017   (DE) .................. 102017105855.9

(51) Int. Cl.
*C09K 11/77* (2006.01)
*H01L 33/50* (2010.01)
(Continued)

(52) U.S. Cl.
CPC ...... *C09K 11/7795* (2013.01); *C09K 11/7777* (2013.01); *H01L 31/055* (2013.01);
(Continued)

(58) Field of Classification Search
CPC ....... B82Y 20/00; B82Y 40/00; Y10S 977/00; Y10S 977/70; Y10S 977/773;
(Continued)

(56) References Cited

U.S. PATENT DOCUMENTS

| | | |
|---|---|---|
| 2011/0044046 A1 | 2/2011 | Abu-Ageel |
| 2012/0032142 A1 | 2/2012 | Leatherdale |

(Continued)

FOREIGN PATENT DOCUMENTS

| | | |
|---|---|---|
| CN | 104364346 A | 2/2015 |
| EP | 2553048 B1 | 8/2011 |

(Continued)

OTHER PUBLICATIONS

Chander. Development of nanophosphors—a review, Materials Science and Engineering R49 (2005), pp. 113-155 (Year: 2005).*

(Continued)

*Primary Examiner* — Galina G Yushina
(74) *Attorney, Agent, or Firm* — David P. Owen; Hoyng Rokh Monegier B.V.

(57) ABSTRACT

The invention relates to a converter system, for instance for a light emitting device, comprising: —a first material, which comprises, preferably essentially consists of an emitting material, emitting a color of interest, and is essentially free of sensitizer material, —a second sensitizer material, which is essentially free of the first material and absorbs light (is excitable) in the wavelength range of interest and its emission spectrum overlaps at least partly with one or more excitation bands of the first material.

14 Claims, 4 Drawing Sheets

(51) Int. Cl.
*H01L 31/055* (2014.01)
*B82Y 20/00* (2011.01)
*B82Y 40/00* (2011.01)

(52) U.S. Cl.
CPC ............ H01L 33/50 (2013.01); H01L 33/502 (2013.01); *B82Y 20/00* (2013.01); *B82Y 40/00* (2013.01); *Y10S 430/127* (2013.01); *Y10S 977/00* (2013.01); *Y10S 977/70* (2013.01); *Y10S 977/773* (2013.01); *Y10S 977/902* (2013.01); *Y10S 977/932* (2013.01); *Y10S 977/949* (2013.01)

(58) Field of Classification Search
CPC ............ Y10S 977/902; Y10S 977/932; Y10S 977/949; Y10S 430/127; C09K 11/7795; C09K 11/7777; H01L 31/055; H01L 33/50; H01L 33/502; Y02E 10/52
See application file for complete search history.

(56) References Cited

U.S. PATENT DOCUMENTS

2012/0037885 A1* 2/2012 Schardt ................ H01L 27/156
257/13

2012/0248479 A1* 10/2012 Anc ........................ B82Y 20/00
977/774
2015/0236220 A1* 8/2015 Selvin ................ C09K 11/0811
435/40.51
2017/0222100 A1 8/2017 David

FOREIGN PATENT DOCUMENTS

| EP | 3149782 B1 | | 9/2017 | |
|---|---|---|---|---|
| JP | 2008547235 A | | 12/2008 | |
| JP | 2015086284 A | | 5/2015 | |
| NL | WO 2015180976 | * | 3/2015 | ............ H01L 33/50 |
| WO | 2007007954 A | | 1/2007 | |
| WO | 2010123814 A1 | | 10/2010 | |
| WO | 2013166601 A1 | | 11/2013 | |

OTHER PUBLICATIONS

Chou et al. Forster Resonance Energy Transfer between Quantum Dot donors and quantum Dot Acceptors. Sensors, 2015, 15, pp. 13288-13325 (Year: 2015).*
Gengwen Chen, et al., Fluorescent Nanosensors Based on Fluorescence Resonance Energy Transfer (FRET), Industrial & Engineering Chemistry Research, Jan. 24, 2013, vol. 52, pp. 11228-11245.
Robert M. Clegg, Fluorescence resonance energy transfer, Current Opinion in Biotechnology, 1995, vol. 6, pp. 103-110.

* cited by examiner

CONVERTER SYSTEM

This is a Continuation of U.S. application Ser. No. 16/487,439, filed 21 Aug. 2019, which is a national stage entry based on international application PCT/EP2018/056660 filed 16 Mar. 2018, which is incorporated herein in its entirety.

The present invention relates to the field of converter systems for light emitting devices and suitable materials therefor, more specifically light emitting diode (LEDs) and laser diodes (LDs).

These devices usually are based on a blue-, violet-, and/or UV-emitting semiconductor material, most often based on the (Al,In,Ga)N material system, and then the primary radiation is converted by suitable down-conversion media (e.g., phosphors) into blue, green, yellow and/or red or other colors (depending on the application).

Of particular interest are luminescence conversion materials or systems, which are excitable via absorption in the UV-A, violet, blue or green spectral range (approximately 380-580 nm) and to emit red, orange or yellow. However, many of potentially interesting materials have inadequate excitation properties, either that the excitation strength in the wavelength areas that are emitted by nowadays blue, violet and/or UV emitting semiconductor materials is too low or that there are other causes for low excitation probability.

To give an example: Of special interest are materials and systems which employ $Eu^{3+}$ since this ion shows excellent emittance properties in various host lattices. The issue is however, that $Eu^{3+}$ phosphors usually exhibit low absorption of visible light due to quantum mechanical selection rules related to forbidden transitions. Much effort has been made to increase the excitation strength of $Eu^{3+}$.

One possible way to increase the excitation strength of $Eu^{3+}$ phosphors would be the use of a sensitizer ion. However, so far the approaches to increase the excitation strength of $Eu^{3+}$ phosphors via sensitizers have not led to materials and/or systems which can be used in today's LED and LD systems.

It is thus an object to provide a light emitting device and/or a suitable material system which is able to overcome these disadvantages at least partly. This object is achieved by a converter system, for instance for a light emitting device, said converter system comprising:
 a first material, which comprises, preferably essentially consists of an emitting material, emitting a color of interest, and is essentially free of sensitizer material,
 a second sensitizer material, which is essentially free of the first material and absorbs light (is excitable) in the wavelength range of interest and its emission spectrum overlaps at least partly with one or more excitation bands of the first material.

It is found that a first material and sensitizer material may be so arranged to each other to allow energy transfer from the sensitizer material to the light emitting material in the first material. Accordingly, a converter system for a light emitting device is proposed, comprising:
 a first material, which comprises, preferably essentially consists of an emitting material, emitting a color of interest, and is essentially free of sensitizer material,
 a second sensitizer material, which is essentially free of the first material and absorbs light (is excitable) in the wavelength range of interest and its emission spectrum overlaps at least partly with one or more excitation bands of the first material,
 whereby the first material and sensitizer material are so arranged to each other to allow energy transfer from the sensitizer material to the light emitting material in the first material.

The term "essentially free" in the context of the present invention especially means and/or includes a concentration of ≤0.1 wt % or less, preferably ≤0.01 wt % or less.

In the sense of the present invention the term "essentially provided as" or "essentially consisting of" or the like independently each time means 95 wt %, more preferably 98 wt %, most preferred 99 wt %.

According to the present invention, the term "light emitting" or "emitting" refers to and/or encompasses a material which upon suitable excitation shows efficient light emission in a wavelength range of interest. The emittance will in many applications be due to a suitable emitting ion embedded in a suitable crystal.

The skilled person will understand that energy transfer (sometimes also referred to as Fluorescent Resonance Energy Transfer, FRET) from the sensitizer material to the light emitting material involves the non-radiative transfer of energy from an excited sensitizer ion in the sensitizer material to an acceptor (or emitter) ion in the emitting material. It is evidenced by increased selective excitation of the sensitizer ion in the sensitizer material resulting in increased emission from an emitter ion in the emitting material.

The first material and sensitizer material may be so arranged to each other to allow energy transfer from the sensitizer material to the light emitting material in the first material in any suitable manner. The skilled person will realize that—since resonant energy transfer is in first order inversely proportional to inter-ion distance at the power of 6—the arrangement to allow energy transfer may be effected by proper engineering of the effective distances between the sensitizer ions in the sensitizer material and the emitter ions in the emitting material.

For instance, arrangement to allow energy transfer from the sensitizer material to the light emitting material in the first material may be achieved by dissolving the first material (preferably in the form of nanoparticles) and the second material (preferably in the form of nanoparticles) in a solvent, and evaporating the solvent. The resulting clusters of nanoparticles will include those of the first and second materials in close enough proximity to allow significant energy transfer between them.

Any suitable solvent may be used. The skilled person is able to select a preferred solvent considering the nature of the nanoparticles. In the event of hydrophobic nanoparticles, a non-polar solvent is preferably used. In the event of hydrophilic nanoparticles a polar solvent is preferably used. The solvent may for instance be an alcohol, such as for instance isopropanol.

The process may involve removing ligands from the nanoparticles prior to drying of the mixed nanoparticles. Removal of ligands may be effected by contacting the nanoparticles with an acid, for instance by adding HCl to the nanoparticle solution, optionally followed by one or more washing steps. Arrangement to allow energy transfer may, for instance, also be achieved by providing the arrangements as indicated in any one of FIGS. 1 to 6, as will be discussed hereinafter.

The degree of energy transfer may be optimized by tuning the mixing ratios, particle shapes and size distributions, and sensitizer and emitter ion doping levels, as well as by the selection of host lattices of each material.

According to a preferred embodiment of the present invention, the color of interest includes red, thus the light emitting material emits light in the red wavelength area and/or is red emitting. According to the present invention, the term "red emitting" refers to and/or encompasses a material which upon suitable excitation has one or more emission bands between 600 nm and 650 nm. According to alternative embodiments of the present invention, the color of interest may include amber and/or orange (580-600 nm), yellow (560-580 nm), green (510-560 nm), cyan (480-510 nm), or even blue (440-480 nm).

According to a preferred embodiment of the present invention the light emitting material comprises one or more of the ions of the group comprising $Eu^{3+}$, $Tb^{3+}$ and $Mn^{4+}$. Especially preferred is $Eu^{3+}$.

According to the present invention, the term "sensitizer material" especially means and/or a includes a material or one or more ions in that material which are capable of increasing the excitation of the first light emitting material, especially of the light emitting ions in that first material, upon suitable excitation.

According to a preferred embodiment of the present invention, the sensitizer material comprises one or more ions selected out of the group of lanthanides and bismuth, especially one or more ions selected out of the group comprising $Eu^{2+}$, $Pb^{2+}$, $Tb^{3+}$, $Bi^{3+}$ and $Ce^{3+}$.

It should be noted that the sensitizer material according to an embodiment and many applications of the present invention may actually be also a phosphor material of the light emitting device in which the converter system is used. In certain cases, especially when white light is desired, it may be advantageous to combine light emitted by the sensitizer material with that emitted by the activator ions.

Surprisingly, it has so been found that the properties of the light emitting device can be greatly improved in many applications and thus $Eu^{3+}$ ions may be reasonably used in light emitting devices, since due to the inventive converter system a sufficient emission intensity is ensured, preferably upon excitation in the violet/blue spectral range and using reasonable material densities and thicknesses.

In particular, the device according to the present invention in most embodiments and specific forms provides one or more of the following advantages:
- The inventive converter system allows for an efficient absorption of excitation light and significant transfer of this energy to the $Eu^{3+}$ containing material, resulting in excitation of $Eu^{3+}$ ions.
- Losses due to charge-transfer quenching, which usually occur for certain emitter-sensitizer pairs, when the sensitizer ion and the $Eu^{3+}$ are in too close proximity, as for the case where they are incorporated in the same material, can be avoided or at least greatly reduced.
- The converter system can be used in existing devices and does not need a sophisticated setup.
- The use of a sensitizing material allows for a much greater efficacy of the device and also a greater degree of freedom to "tune" the excitation and emission wavelength of the light emitting device independently to a certain extent.

It should be noted that according to the present invention the host material of the first emitting material and the host material of the sensitizer ion do not need to be distinct from each other. Actually according to a preferred embodiment of the present invention, the first material and sensitizer material may have the same host material or form an integral part of the same host material, but the first material forms one or several zones within the host material, whereas the sensitizer material forms one or several distinct other zones within the host material.

According to a preferred embodiment of the present invention, the first material is provided, preferably essentially provided as a nanophosphor.

According to the present invention, the term "nanophosphor" in the context of the present invention especially means and/or includes a topology in which at least one dimension thereof is in a nanometer scale, preferably 100 nm or less.

It should be noted that the first material together with the second material may comprise much larger structures.

Methods of producing such nanophosphors are inter alia described in *Development of nanophosphors—A review*, H. Chander, Materials Science and Engineering, 49, 113-155 (2005).

According to a preferred embodiment of the present invention, the first material is provided, preferably essentially provided as nanoparticles.

In this regard it is especially preferred that at least one dimension, preferably the average diameter of the nanoparticles is $\geq 1$ nm and $\leq 50$ nm, preferably $\geq 2$ nm and $\leq 10$ nm. By doing so for most applications this is a good compromise between allowing energy transfer from the sensitizer material to the first material while preventing losses due to charge-transfer quenching and allowing reproducible synthesis methods.

It should be noted that according to a preferred embodiment the nanoparticles have a core-shell structure with undoped material forming the core and the first material forming a shell around the core. Advantages include to be able to lower the amount of the $Eu^{3+}$ used and to increase overall energy transfer efficiency.

If this embodiment is used, it is especially preferred that the thickness of the shell essentially made out of the first material is $\geq 0.5$ nm and $\leq 5$ nm.

According to a preferred embodiment of the present invention, the first material is provided, preferably essentially provided as a nanolayer, i.e. a layer in which the thickness of the layer is in a nanometer scale, preferably $\leq 100$ nm or less, preferably $\geq 0.5$ nm and $\leq 0$ nm, whereas the width and breadth may be larger.

According to a preferred embodiment the sensitizer material is provided, preferably essentially provided as a nanophosphor (or nanoparticles), whereby mutatis mutandis and independently from the first material the above description can be applied here, too.

It should be noted that in many applications using nanoparticles, these nanoparticles often are generally difficult to use due to instability issues (like quantum dots). However, it has been observed that if both the first and the sensitizer material are provided in form of nanoparticles, they cluster into microparticles upon drying without losing their luminescent properties, which can then be treated as normal powders.

In order to enhance this clustering, according to a preferred embodiment of the present invention both material separately from each other are kept stable in solution using surface capping molecules, such as bulky organic molecules. Then in a second step both materials are mixed and then the capping molecules are removed, thus resulting in a clustering in microparticles.

According to a preferred embodiment of the present invention, the sensitizer material is provided, preferably essentially provided as a bulk material with the first material provided on the sensitizer material. In this context the term "bulk" especially means and/or includes greater than nanoscale, for example >100 nm diameter and including microsize scales.

According to a further embodiment of the invention the first and/or sensitizer material is provided, preferably essentially provided as a ceramic.

The term "ceramic" according to the present invention refers to and/or encompasses in particular a compact crystalline or polycrystalline material which includes a controlled amount of pores or is non-porous.

The term "polycrystalline material" according to the present invention refers to and/or encompasses in particular a material having a bulk density of greater than 90 percent of the main component, consisting of more than 80 percent of individual crystal domains, wherein each crystal domain has a diameter of 0.1-10 μm and a different crystallographic orientation. The individual crystal domains may be bonded to each other or diluted via an amorphous or glassy material or by additional crystalline phases.

According to a preferred embodiment of the present invention the crystalline material has a density of ≥90% to ≤100% of the theoretical density. This has been found to be advantageous for many applications of the present invention.

According to a preferred embodiment, the first and sensitizer material are provided, preferably essentially provided as several shells in a nanophosphor and/or nanoparticle material. In this regard several topologies are preferred within the present invention:

a) Core-Shell-Topologies

According to one embodiment, the first material forms the core whereas the sensitizer material is provided as a shell, according to an alternative the first material forms the shell whereas the sensitizer material forms the core. For both embodiments it is advantageous that both the core as well as the shell independently have a thickness of ≥1 nm and ≤20 nm.

b) Several Shells

The above topology can be expanded to have a structure with several shells. Here the following structures have proven themselves to be especially of interest:

First material as the core, sensitizer material around the core and a second layer of first material around the sensitizer material Sensitizer material as the core, first material around the core and a second layer of sensitizer material around the first material Undoped material as the core, sensitizer material around the core and a second layer of first material around the sensitizer material (or vice-a-versa)

Four layer structures e.g. with an undoped core, then subsequently layers of first material, sensitizer material and first material around the core or with an undoped core, then subsequently layers of second material, first material and second material around the core For all these topologies it is preferred that independently from each other the thickness of each shell and/or the core is ≥0.5 nm and ≤20 nm.

According to a preferred embodiment, the first material comprises, preferably is essentially made out of a material selected from the group comprising $(Ca,Sr)Ga_2O_6$:Eu, $(Ca,Sr,Ba)La_2Bi_2(SiO_4)_3O$:Eu, $(Ca,Sr,Ba)SnO_3$:Eu, $(Ca,Y,Gd)MoO_4$:Eu, $(Y,Gd)BO_3$ (pseudo-vaterite):Eu, $(Y,Tb)SiO_5$:Eu, A-$La_2O_3$:Eu, $Ba_2(SiO_4)$:$O^{2-}$:Eu, $Ba_2MgSi_2O_7$:Eu, $Ba_2Y(BO_3)_2Cl$:Eu, $Ba_3(PO_4)_2$:Eu, $Ba_3Ca_3(PO_4)_4$:Eu, $Ba_3Gd(BO_3)_3$:Eu, $Ba_3Gd_2(BO_3)_4$:Eu, $Ba_3La_2(BO_3)_4$:Eu, $Ba_3V_2O_8$:Eu, $Ba_3Y_2(BO_3)_4$:Eu, $BaB_8O_{13}$:Eu, $BaBPO_5$:Eu, $BaFCl$:Eu, $BaGd_2O_4$:Eu, $BaGd_4Si_5O_{17}$:Sm:Eu, $BaGdB_9O_{16}$:Eu, $BaLaB_9O_{16}$:Eu, $BaSO_4$:Eu, $BaY_2Fs$:Yb:Eu, $BaY_2Si_3O_{10}$:Eu, $BaYB_9O_{16}$:Eu, $BaZr(BO_3)_2$:Eu, $BaZrO_3$:Eu, $BaZrO_3$:Eu, b-$BaB_2O_4$:Eu, B—$Gd_2O_3$:Eu, $Ca_2Al(AlSiO_7)$:Eu, $Ca_2Gd_2(GeO_4)_2O$:Eu, $Ca_2Gd_8(SiO_4)_6O_2$:Eu, $Ca_2Gd_8Si_6O_{26}$:Eu, $Ca_2La_8(SiO_4)_6O_2$:Eu, $Ca_3(BO_3)_2$:Eu, $Ca_3Al_2O_6$:Eu, $Ca_3Gd_2(BO_3)_4$:Eu, $Ca_3La_2(BO_3)_4$:Eu, $Ca_3Y_2(BO_3)_4$:Eu, $Ca_4GdO(BO_3)_3$:Eu, $Ca_5(PO_{11})_3F$:Eu, $Ca_5(PO_4)_3Br$Eu, $Ca_5(PO_4)_3F$:(4f-site):Eu, $Ca_5(PO_4)_3F$:(6h-site):Eu, $Ca_5(PO_4)_3OH$:Eu, $CaBPO_5$:Eu, $CaF_2$:Eu, $CaLaB_7O_{13}$:Eu, calcite-$CaCO_3$:Eu, CaO:Eu, $CaSO_4$:Eu, $CaYO(BO_3)$:Eu, C—$Gd_2O_3$:Eu, C—$Lu_2O_3$:(C2):Eu, C—$Lu_2O_3$:(C3i):Eu, $Cs_2NaYF_6$:Tm:Eu, C—$Sc_2O_3$:Yb:Eu, C—$Y_2O_3$:Eu, Eu[(ttfa)$_3$(phen)]:Eu, $Gd_{17.33}(BO_3)_4(B_2O_5)_2O_{16}$:Eu, $Gd_2BaZnO_5$:Eu, $Gd_2O_2(SO_4)$:Eu, $Gd_2P_4O_{13}$:Eu, $Gd_3O_4Br$:Eu, $Gd_3PO_7$:Eu, $Gd_3Te_2Li_3O_{12}$:Eu, $Gd_8P_2O_{17}$:Eu, $GdAl_3(BO_3)_4$:Eu, $GdAlO_3$:Eu, $GdAlO_3$:Eu, $GdB_3O_6$:Eu, $GdBO_3$:Eu, $GdGaO_3$:Eu, GdOBr:Eu, GdOCl:Eu, $GdP_3O_9$:Eu, $GdPO_4$:Eu, I—$CaB_2O_4$:Eu, $InBO_3$:Eu, I—$SrB_2O_4$:Eu, $KCaGd(PO_4)_2$:Eu, $La_{26}O_{27}(BO_3)_8$:Eu, $La_2BaZnO_5$:Eu, $La_2Hf_2O_7$:Eu, $La_2O_2(SO_4)$:Eu, $La_2O_2S$:Eu, $La_2O_2S$:Eu, $La_2W_3O_{12}$:Eu, $La_2Zr_3(MoO_4)_9$:Eu, $La_3TaO_4Cl_6$:Eu, $La_3TaO_4Cl_6$:Eu, $La_3WO_6Cl_3$:Eu, $La_3WO_6Cl_3$:Eu, $LaA_1O_3$:Eu, $LaA_1O_3$:Eu, $LaB_3O_6$:Eu, $LaBO_3$:Eu, $LaF_3$:Eu, $LaF_3$:Eu, $LaGaO_3$:Eu, $LaMgB_5O_{10}$:Eu, LaOBr:Eu, LaOCl:Eu, LaOF:Eu, LaOI:Eu, $LaP_3O_9$:Eu, $LaPO_4$:Eu, $LaYO_3$:Eu, $Li_2Lu_5O_4(BO_3)_3$:Eu, $Li_3Ba_2La_3(MoO_4)_8$:Eu, $Li_3La_2(BO_3)_3$:Eu, $Li_6Gd(BO_3)_3$:Eu, $Li_6Y(BO_3)_3$:Eu, $LiCaAlF_6$:Eu, $LiEuMo_2O_8$:Eu, $LiGd_6O_5(BO_3)_3$:Eu, $LiGdF_4$:Eu, $LiGdGeO_4$:Eu, $LiGdO_2$:Eu, $LiGdSiO_4$:Eu, $LiLa_2O_2BO_3$:Eu, $LiLaGeO_4$:Eu, $LiLaO_2$:Eu, $LiLaP_4O_{12}$:Eu, $LiLaSiO_4$:Eu, $LiLuGeO_4$:Eu, $LiLuO_2$:Eu, $LiLuSiO_4$:Eu, $LiScO_2$:Eu, $LiSr_2YO_4$:Eu, $LiSrAlF_6$:Eu, $LiSrAlF_6$:Eu, $LiY_6O_5(BO_3)_3$:Eu, $LiYF_4$:Eu, $LiYGeO_4$:Eu, $LiYO_2$:Eu, $LiYSiO_4$:Eu, $Lu_2O_2(SO_4)$:Eu, $Lu_2Si_2O_7$:Eu, $Lu_3Al_5O_{12}$:Eu, $Lu_3Al_5O_{12}$:Yb:Eu, $LuBO_3$:Eu, $LuBO_3$ (calcite):Eu, LuOCl:Eu, $LuPO_4$:Eu, $Mg_2Gd_8(SiO_4)_6O_2$:Eu, $Mg_2La_8(SiO_4)_6O_2$:Eu, MgO:Eu, $MgSiO_3$:Eu, $Na_3YSi_3O_9$:Eu, $Na_6Gd(BO_3)_3$:Eu, $NaGdGeO_4$:Eu, $NaGdO_2$:Eu, $NaGdSiO_4$:Eu, $NaGdSiO_4$:Eu, $NaLaGeO_4$:Eu, $NaLaO_2$:Eu, $NaLaSiO_4$:Eu, $NaLuGeO_4$:Eu, $NaLuSiO_4$:Eu, $NaScO_2$:Eu, $NaSrLa(VO_4)_2$:Eu, $NaYGeO_4$:Eu, $NaYSiO_4$:Eu, $ScBO_3$:Eu, ScOCl:Eu, $ScPO_4$:Eu, $Sr_2B_2O_5$:Eu, $Sr_2Gd_8(SiO_4)_6O_2$:Eu, $Sr_2La_2Zn_2O_7$:Eu, $Sr_2La_2Zn_2O_7$:Eu, $Sr_2LaAlO_5$:Eu, $Sr_3(BO_3)_2$:Eu, $Sr_3(PO_4)_2$:Eu, $Sr_3(PO_4)_2$:Sm:Eu, $Sr_3Gd_2(BO_3)_4$:Eu, $Sr_3La_2(BO_3)_4$:Eu, $Sr_3La_6(SiO_4)_6$:Eu, $Sr_3Y_2(BO_3)_4$:Eu, $Sr_5(PO_4)_3F$:Eu, $Sr_9Ln(VO_4)_7$:Eu, $SrAl_2B_2O_7$:Eu, $SrB_4O_7$:Eu, $SrB_6O_{10}$:Eu, $SrCO_3$:Eu, $SrGdAlO_4$:Eu, $SrHfO_3$:Tm:Eu, $SrLa_2BeO_5$:(4c):Eu, $SrLa_2BeO_5$:(8d):Eu, $SrLaAlO_4$:Eu, $SrLaGa_3O_7$:Eu, $SrLaO(BO_3)$:Eu, SrO:Eu, $SrY_2O_4$:(Sr-site):Eu, $SrY_2O_4$:(Y-site1):Eu, $SrY_2O_4$:(Y-site2):Eu, $Tb_2Mo_3O_{12}$:Eu, $Tb_2W_3O_{12}$:Eu, $TbBO_3$:Eu, $ThO_2$:Eu, X1-$Gd_2SiO_5$:Eu, X1-$Y_2SiO_5$:Eu, X2-$Y_2SiO_5$:Eu, $Y_{17.33}(BO_3)_4(B_2O_5)_2O_{16}$:Eu, $Y_2Ge_2O_7$:Eu, $Y_2GeO_5$:Eu, $Y_2O_2(SO_4)$:Eu, $Y_2O_2S$:Eu, $Y_2O_2S$:Eu, $Y_2O_3$:Eu, $Y_2P_4O_{13}$:Eu, $Y_2Si_2O_7$:Eu, $Y_2SiO_5$:Eu, $Y_3Al_5O_{12}$:Eu, $Y_3Ga_5O_{12}$:Eu, $Y_3O_4Br$:Eu, $Y_3O_4Cl$:Eu, $Y_3PO_7$:Eu, $Y_4GeO_8$:Eu, $Y_8P_2O_{17}$:Eu, $YAl_3(BO_3)_4$:Eu, $YAlO_3$:Eu, $YAlO_3$:Eu, $YBO_3$:Eu, YbOBr:Yb:Eu, $YF_3$:Eu, YOBr:Eu, YOCl:Eu, YOCl:Eu, YOF:Eu, YOF:Eu, $YP_3O_9$:Eu, $YPO_4$:Eu, $YPO_4$:Eu, $YTaO_4$:Eu, $YVO_4$:Eu, $ZrP_2O_7$:Eu, or mixtures thereof.

According to a preferred embodiment, the sensitizer material comprises, preferably is essentially made out of a material selected from the group comprising $(Sr_n,Ca_{1-n})_{10}(PO_4)_6*B_2O_3$:$Eu^{2+}$ (wherein $0 \le n \le 1$), $(Ba,Sr,Ca)_5(PO_4)_3(Cl,F,Br,OH)$:$Eu^{2+}$,$Mn^{2+}$, $(Ba,Sr,Ca)BPO_5$:$Eu^{2+}$,$Mn^{2+}$, $Sr_2Si_3O_3*2SrCl_2$:$Eu^{2+}$, $(Ca,Sr,Ba)_3MgSi_2O_8$:$Eu^{2+}$,$Mn^{2+}$, $BaAl_8O_{13}:Eu^{2+}$, $2SrO*0.84P_2O_5*0.16B_2O_3:Eu^{2+}$, $(Ba,Sr,Ca)MgAl_{10}O_{17}:Eu^{2+},Mn^{2+}$, $K_2SiF_6:Mn^{4+}$, $(Ba,Sr,Ca)Al_2O_4:Eu^{2+}$, $(Y,Gd,Lu,Sc,La)BO_3:Ce^{3+},Tb^{3+}$, $(Ba\ Sr,Ca)_2(Mg,Zn)Si_2O_7:Eu^{2+}$, $(Mg,Ca,Sr,Ba,Zn)_2Si_{1-x}O_{4-2x}:Eu^{2+}$ (wherein $0\le x\le 0.2$), $(Sr,Ca,Ba)(Al,Ga)_2S_4:Eu^{2+}$, $(Ca,Sr)_6(Mg,Zn)(SiO_4)_4Cl_2:Eu^{2+},Mn^{2+}$, $Na_2Gd_2B_2O_7:Ce^{3+},Tb^{3+}$, $(Sr,Ca,Ba,Mg,Zn)_2P_2O_7:Eu^{2+},Mn^{2+}$, $(Ca,Sr)S:Eu^{2+},Ce^{3+}$, $(Y,Gd,Tb,La,Sm,Pr,Lu)_3(Sc,Al,Ga)_{5-n}O_{12-3/2n}:Ce^{3+}$ (wherein $0\le n\le 0.5$), $ZnS:Cu+, Cl-$, $(Y,Lu,Th)_3Al_5O_{12}:Ce^{3+}$, $ZnS:Cu+,Al3+$, $ZhS:Ag+,Al3+$, $ZnS:Ag+,Cl-$, $(Ca, Sr)Ga_2S_4:Eu^{2+}$, $SrY_2S_4:Eu^{2+}$, $CaLa_2S_4:Ce^{3+}$, $(Ba,Sr,Ca)MgP_2O_7:Eu^{2+},Mn^{2+}$, $CaWO_4$, $(Ba,Sr,Ca)_nSi_nN_n:Eu^{2+}$ (where $2n+4=3n$), $Ca_3(SiO_4)Cl_2:Eu^{2+}$, $(Y,Lu,Gd)_{2-n}Ca_nSi_4N_{6+n}C_{1-n}:Ce^{3+}$, (wherein $0\le n\le 0.5$), $(Lu,Ca,Li,Mg,Y)$ alpha-SiAlON doped with $Eu^{2+}$ and/or $Ce^{3+}$, $(Ca,Sr,Ba)SiO_2N_2:Eu^{2+},Ce^{3+}$, $(Sr,Ca)AlSiN_3:Eu^{2+}$, $CaAlSi(ON)_3:Eu^{2+}$, $Sr_{10}(PO_4)_6Cl_2:Eu^{2+}$, $(BaSi)O_{12}N_2:Eu^{2+}$, $SrSi_2(O,Cl)_2N_2:Eu^{2+}$, $(Ba,Sr)Si_2(O,Cl)_2N_2:Eu^{2+}$ or mixtures thereof.

The converter system according to the invention can be used in a variety of specific topological structures or applications, including—but not limited thereto—the following:

1. "Direct Deposited Phosphor Powder":

The converter system material is synthesized in powder form (either nano- and/or micro-sized, as described above and depending on the size distribution of the larger material particles) and applied directly to the LED chip or package by any number of means, including but not limited to, dispensing within a binder (e.g., silicone), screen-printing, electrophoresis, or incorporated into solid-form binders and laminated onto the LED chips or LED wafer.

2. "Direct Deposited Phosphor Ceramic":

The phosphor ceramic is applied directly as a thin plate onto an LED dice.

3. "Remote Phosphor" Systems:

"Remote phosphor" systems in particular mean devices in which a phosphor (luminophore, engl.:phosphor) is arranged remote from a light emitting light source emitting in a narrow wavelength range, usually embedded in or linked to a polymer, glass or ceramic matrix. Thus, a remote phosphor system is fundamentally different from a system in which the phosphor is applied directly onto or at the light source such as in LED light sources in which the phosphor is applied directly onto the light emitting dice. Usually, a distinction is made between two basic structures, from which many variants can be derived:

a) "Remote phosphor in transmission mode": The phosphor matrix is placed onto a reflection chamber in which the LED is disposed. The light can escape only through the phosphor matrix (transmission).

b) "Remote phosphor in reflection mode": The phosphor matrix is applied onto a reflective carrier or is coated with a reflective material on the back side, the LED light source is disposed in or slightly sideward from the emission direction and irradiates onto the phosphor matrix. The converted light is re-emitted in the direction of the light source or in the radiation direction, the light which has passed through the phosphor matrix is re-directed through the phosphor matrix in the emission direction by means of the back side reflective layer. Thus, the light can only escape in the reflection direction.

The present invention also relates to a light emitting device comprising a converter system according to the present invention and a blue light emitting material.

This blue emitting material serves as a primary light source and preferably is a blue emitting LED Chip.

Preferably this blue light emitting materials emits light towards the converter system with a wavelength of <470 nm, preferably ≥430 to ≤465 nm. It has surprisingly been found that this has been advantageous for many applications within the present invention although the second material with in the present invention has an excitation maximum at 465 nm.

A light emitting device and/or a converter system phosphor according to the present invention may be of use in a broad variety of systems and/or applications, amongst them one or more of the following:

Office lighting systems
household application systems
shop lighting systems,
home lighting systems,
accent lighting systems,
spot lighting systems,
theater lighting systems,
fiber-optics application systems,
projection systems,
self-lit display systems,
pixelated display systems,
segmented display systems,
warning sign systems,
medical lighting application systems,
indicator sign systems, and
decorative lighting systems
portable systems
automotive applications
green house lighting systems The devices to be used according to the invention mentioned above and claimed and described in the exemplary embodiments are not subject to any particular exceptions with respect to their size, shape, material selection and technical conception, so that the selection criteria well-known in the field of application can be applied without restriction.

Further details, features and advantages of the object of the present invention can be obtained from the subclaims and from the following description of the accompanying drawings, in which—by way of example—several embodiments of the device according to the invention are shown, as well as with respect to the examples, which are to be considered as purely illustrative and not limiting. In the drawings:

Hereinafter the invention is explained by way of examples, which are to be considered purely as illustrative and not as limiting.

Figure 1:
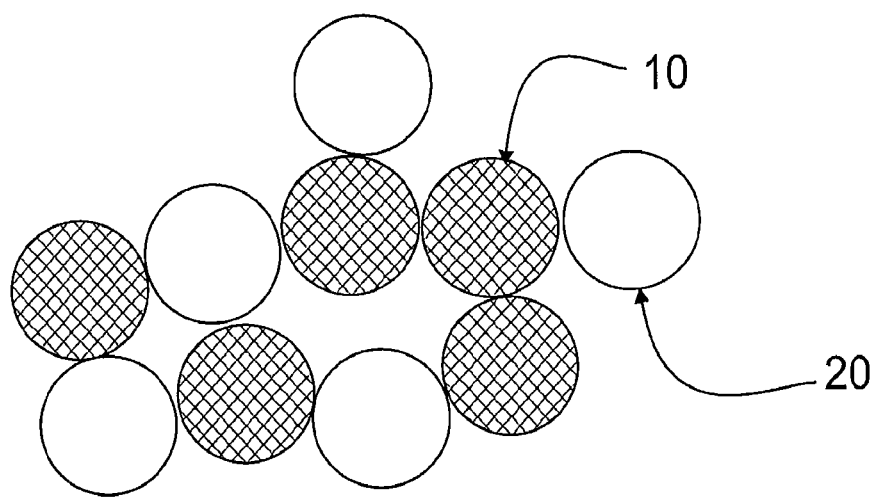
FIG. 1 shows a first embodiment of a converter system according to the present invention.

FIG. 1 shows—very schematically—a first embodiment of a converter system according to the present invention, in with both the first material 10 and the sensitizer material 20 are provided in the form of nanoparticles. As can be seen from FIG. 1 the surface-to-surface distance between the particles is small enough to allow for energy transfer from the sensitizer material 20 to the first material 10.

However, the undesired charge-transfer quenching usually does not or only seldom occur because here the distance between the sensitizer material and the $Eu^{3+}$ of the first material is usually too large.

Figure 2:
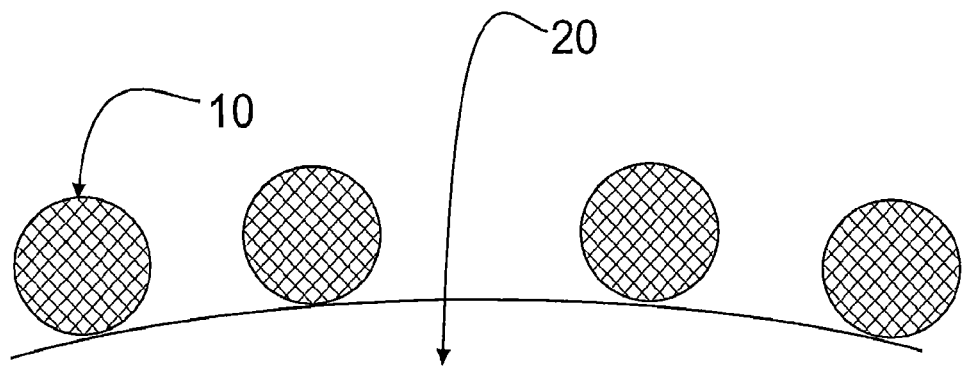
FIG. 2 shows a second embodiment of a converter system according to the present invention.

FIG. 2 shows—very schematically—a second embodiment of a converter system according to the present invention. In this embodiment, the sensitizer material 20 is provided as a bulk material with the first material 10 provided as nanoparticles surrounding the sensitizer material. This approach has been shown to be especially promising if the emission of the sensitizer is also desired in the spectrum of the device, e.g., if the sensitizer material comprises YAG:Ce or the like.

FIGS. 3 to 6 show very schematical cross-sectional views through nanoparticles according to the third to sixth embodiment of the present invention.

Figure 3:
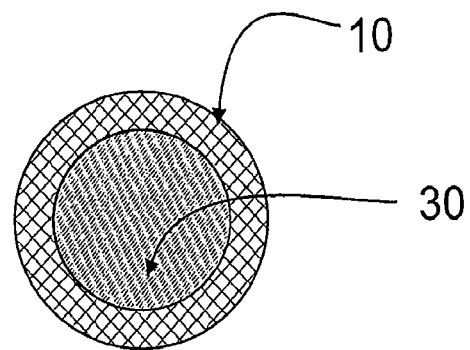
FIG. 3 shows a very schematical cross-sectional view through a nanoparticle according to a third embodiment of the present invention.

In FIG. 3 the nanoparticle has a core formed out of an undoped material 30 with the first material 10 forming a shell around it. It goes without saying that also an alternative embodiment where the sensitizer material forms the shell is an embodiment of the present invention.

Figure 4:
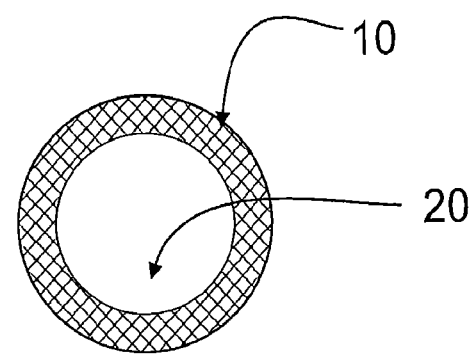
FIG. 4 shows a very schematical cross-sectional view through a nanoparticle according to a third embodiment of the present invention.
Figure 5:
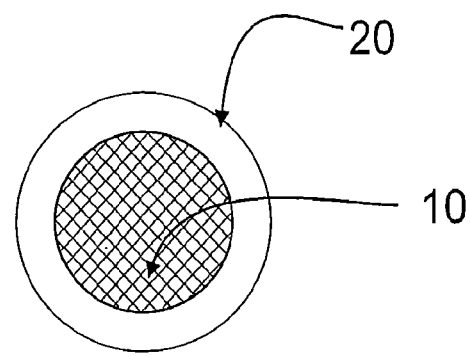
FIG. 5 shows a very schematical cross-sectional view through a nanoparticle according to a third embodiment of the present invention.

In FIG. 4 the sensitizer material 20 forms the core with the first material 10 provided as a shell around the core, in FIG. 5 it is the other way around i.e. the first material 10 forms the core, the sensitizer material 20 the shell.

Figure 6:
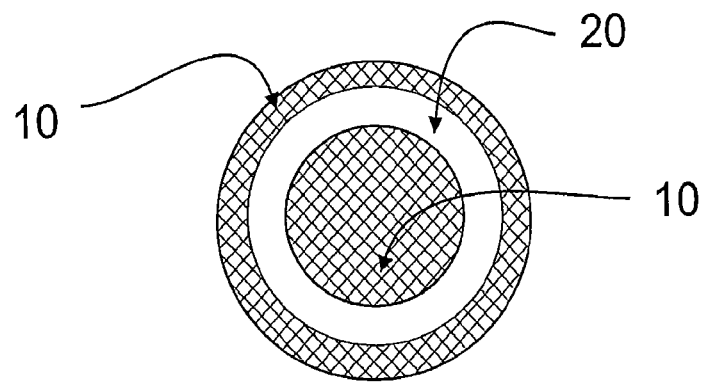
FIG. 6 shows a very schematical cross-sectional view through a nanoparticle according to a third embodiment of the present invention.

The embodiment of FIG. 6 shows a more complex structure with the first material 10 forming another shell around the particle of the embodiment of FIG. 5. It goes without saying that also here the roles may be reversed (i.e. the sensitizer material forming the core and the outer shell with the first material in between) or also topologies where undoped material is forming a shell or the core also are a part of the present invention.

In an exemplary embodiment, the sensitizer material may be a blue-excitable yellow-/green-emitting material, while the first material may be a $Eu^{3+}$ containing material. The sensitizer and first materials may be combined together to form a mixture, preferably as taught herein above, or are brought together in one of the core-shell structures as described above. Under blue excitation of the mixture, some sensitizer ions transfer their energy to $Eu^{3+}$, effectively increasing the excitation probability of $Eu^{3+}$ via blue light. Often, not all the sensitizer ions will transfer energy to $Eu^{3+}$, but will instead emit (yellow/green) light. Thus, under blue excitation, the mixture may produce strong red emission (due to $Eu^{3+}$) but with some residual yellow/green emission, from sensitizer ions. The mixture may be combined with addition yellow/green emitting phosphors (e.g., YAG:Ce, LuAG:Ce, BaSrSiO:Eu, etc.), even in the form of conventional micron-size powders, to create a blended white light emission with the desired optical characteristics such as high lumen equivalent of radiation (LER), correlated color temperature (CCT), and color rendering index (CRI).

In another exemplary embodiment, the sensitizer material is nano-sized YAG:$Ce^{3+}$ particles, (e.g. as described in J. Mater. Chem. C, 2017, 5, 12561), while the emitter material are nano-sized $(Y,V)PO_4$:$Eu^{3+}$ particles. The materials may be brought into intimate contact as described above and in the Examples, so as to enhance energy transfer from $Ce^{3+}$ to $Eu^{3+}$. Under blue excitation of the mixture, some $Ce^{3+}$ ions may transfer their energy to $Eu^{3+}$, effectively increasing the excitation probability of $Eu^{3+}$ for blue light. Often, not all the $Ce^{3+}$ ions will transfer energy to $Eu^{3+}$, but will instead emit (yellow) light. Thus, under blue excitation, the mixture may produce strong red emission (due to $Eu^{3+}$) but with some residual yellow emission (from $Ce^{3+}$). The mixture may be combined with additional yellow/green emitting phosphors (e.g., YAG:Ce, LuAG:Ce, BaSrSiO:Eu, etc.), even in the form of conventional micron-size powders, to create a blended white light emission with the desired optical characteristics such as LER, CCT, and CRI.

The mixtures in the previous embodiments, combined with or without conventional other phosphors, may be applied to a primary emitting LED chip via various deposition techniques well known in the art. Commonly, the materials are bound together in a silicone binder, and applied directly to the chip. The combination of primary LED emission (e.g., UV, violet, blue) may be combined with the down-converted emission of the mixture(s) and other phosphors (if provided) to emit, for example, white light of the desired characteristics.

The individual combinations of the ingredients and the characteristics of the embodiments mentioned above are exemplary, the exchange and substitution of the teachings included in this publication with other teachings included in the cited documents are also explicitly contemplated. A person skilled in the art will recognize that variations and modifications of the embodiments described herein and other embodiments may be realized without departing from the spirit and scope of the invention. Accordingly, the above description is to be considered exemplary and not as limiting. The word "comprises" used in the claims does not exclude other elements or steps. The indefinite article "a" does not exclude the importance of a plural. The mere fact that certain measures are recited in mutually different claims does not indicate that a combination of these measures cannot be used to advantage. The scope of the invention is defined in the following claims and the associated equivalents.

The invention will now be further illustrated using the following examples without however being limited thereto.

EXAMPLES

Example 1

A converter system was prepared using nano-size $LaPO_4$:$Ce^{3+}$ particles (nominal diameter of ~5 nm) as sensitizer material and nano-size $Y(V,P)O_4$:$Eu^{3+}$ particles of nominal diameter of ~10 nm as first material.

The $LaPO_4$:$Ce^{3+}$ particles (3% Ce doping) were synthesized as follows:

$LaCl_3 \cdot 6H_2O$ (9.8 mmol, 3.462 g), $CeCl_3 \cdot 7H_2O$ (0.2 mmol, 74.52 mg) was dissolved in approximately 10 mL of methanol p.a. in a 100 mL 3-neck round-bottomed flask and acquire a clear solution 10.9 mL, 10.650 g (40 mmol) tributyl phosphate was added methanol was removed from solution under vacuum (Schlenk-line), careful with vacuum 30 mL (32 g) diphenyl ether was added Open system, flush afterwards the water released was removed by the hydrated metal chlorides under vacuum at 105° C. (Schlenk line)—water should evaporate around 80-85° C.

reaction mixture was cooled down to below 50° C. and add 9.5 mL, 7.41 g (40 mmol) tributylamine to the clear solution (under nitrogen)

7.0 mL of a 2 M solution phosphoric acid was added in dihexyl ether (1.96 g $H_3PO_4$ was dissolved in 10 mL dihexyl ether under ultrasonification), large vial the mixture was heated to 200° C. for 16 hours and the reaction mixture was cooled to room temperature nanocrystals were separated by centrifuging at 2000 rpm for 5 minutes nanocrystals were washed several times with toluene, careful with adding methanol powder was dried under vacuum The $YVPO_4:Eu^{3+}$ nanoparticles are commercially bought from CAN Gmbh, Hamburg (series X Red Aqua: doping level 7%) and are capped with ethylene glycol.

The $LaPO_4:Ce^{3+}$ and $Y(V,P)O_4:Eu^{3+}$ nanoparticles were mixed in a 15:1 weight ratio and dissolved in 4 mL isopropanol, stirred for ~1.5 hr and then dried at 120° C. in air while stirring, after which the mixed nanoparticles (mixture) are integrated (i.e., clustered) into a white powder. Thus, the different nanoparticles are in intimate contact with one another, such that sensitizer and emitter ions are separated at distances for which energy transfer can efficiently occur.

The converter system obtained was excited by UV light at 300 nm. Excitation and emission spectra were recorded at room temperature using an Edinburgh Instruments FLS920 fluorescence spectrometer. A 450 W Xe lamp was used as excitation source, where the excitation wavelength of interest was selected using a monochromator and the emitted light was detected with a Hamamatsu R928 PMT detector. The measurements were performed on dried powders in reflection mode.

Figure 7:
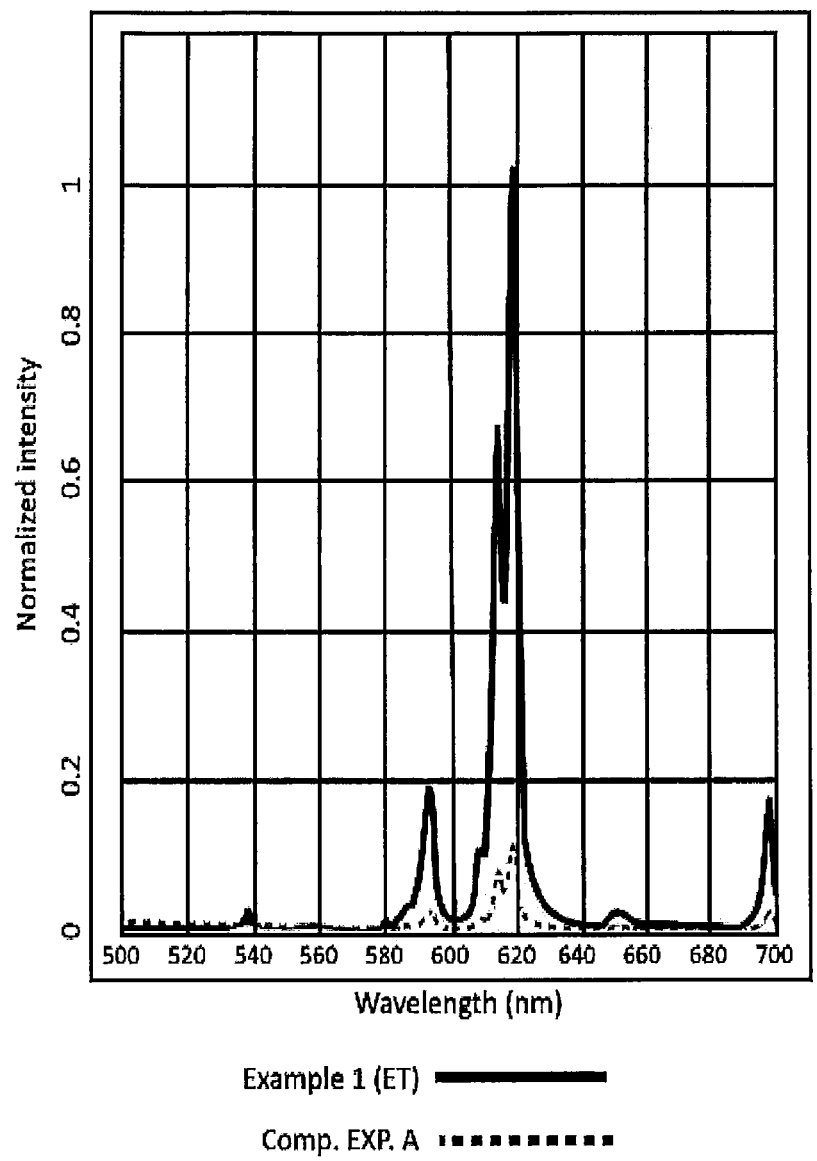
FIG. 7 shows the emission spectrum of a converter system according to the invention and a mixture for comparison purposes when excited by UV light at a wavelength of 300 nm.

The resulting spectrum is shown in FIG. 7.

Comparative Experiment A

The $LaPO_4:Ce^{3+}$ nanoparticles and $YVPO_4:Eu^{3+}$ nanoparticles as described in Example 1 were synthesized and dried separate, before loosely mixing them in a dry state in a 15:1 weight ratio. In this case the different nanoparticles are not in intimate contact with one another, such that sensitizer and emitter ions are separated at distances too large for energy transfer to occur.

The resulting mixture was excited by UV light at 300 nm as described in Example 1. The resulting spectrum is shown in FIG. 7.

The spectrum obtained after exciting the converter system according to the invention (example 1) shows an $Eu^{3+}$ emission peak that is about 10 times higher than the peak obtained for the mixture prepared in comparative experiment A. This 10 times higher $Eu^{3+}$ emission peak shows that exciting the converter system according to the invention (Example 1) resulted in energy transfer. Notably, the peak obtained for the material of comparative experiment A is not the result of energy transfer, but of the direct excitation of the $Eu^{3+}$ at 300 nm, which is also observed when simply exciting the $Y(V,P)O_4:Eu^{3+}$ material by itself.

The mixture according to the invention (Example 1) may be combined with any number of blue- and yellow-/green-emitting down-conversion materials to generate white light.

The invention claimed is:

1. A converter system comprising:
   a first material, which comprises an emitting material, adapted to emit a color of interest, wherein the first material is essentially free of a sensitizer material; and
   a second sensitizer material, which is essentially free of the first material and is excitable in the wavelength range of interest and its emission spectrum overlaps at least partly with one or more excitation bands of the first material,
   wherein the emitting material of the first material comprises one or more of the ions of the group comprising $Eu^{3+}$, $Tb^{3+}$ and $Mn^{4+}$, and
   wherein the second sensitizer material comprises one or more ions selected out of the group $Eu^{2+}$, $Pb^{2+}$, $Bi^{3+}$ and $Ce^{3+}$,
   wherein the emitting material and the second sensitizer material are disposed in different host lattices, and
   wherein the converter system is adapted to radiatively excite the second sensitizer material.

2. The converter system according to claim 1, wherein the first material and second sensitizer material are so arranged to each other to allow energy transfer from the second sensitizer material to the light emitting material in the first material.

3. The converter system according to claim 1, wherein the first material comprises a red emitting material.

4. The converter system according to claim 1, wherein the first material is provided as a nanophosphor.

5. The converter system according to claim 1, wherein the first material is provided as nanoparticles.

6. The converter system according to claim 1, wherein the first material is provided as nanoparticles and the average diameter of the nanoparticles is ≥1 nm and ≤50 nm.

7. The converter system according to claim 1, wherein the second sensitizer material is excitable in the wavelength range between 380 and 580 nm.

8. The converter system according to claim 1, wherein the second sensitizer material is excitable in the UV-A (between 315 and 400 nm), violet (between 400 and 440 nm), blue (between 440 and 480 nm) or green (between 510 and 560 nm) wavelength range.

9. The converter system according to claim 1, wherein the color of interest of the emitting material is in a higher wavelength range than the wavelength range of interest of the second sensitizer material.

10. The converter system according to claim 1, wherein the second sensitizer material is provided as a nanophosphor.

11. The converter system according to claim 1, wherein the converter system is obtainable by a process comprising dissolving the first material and the second sensitizer material in a solvent, and evaporating the solvent.

12. The converter system according to claim 11, wherein the process involves removing ligands from the first material and/or the second sensitizer material prior to the dissolving.

13. A light emitting device comprising a converter system according to claim 1 and a blue light emitting semiconductor material.

14. A system comprising a converter system according to claim 1, the system being one or more of the following:
   office lighting systems,
   household application systems,
   shop lighting systems,
   home lighting systems,
   accent lighting systems,
   spot lighting systems,
   theater lighting systems,
   fiber-optics application systems,
   projection systems,
   self-lit display systems,
   pixelated display systems,
   segmented display systems,
   warning sign systems, medical lighting application systems,
indicator sign systems,
decorative lighting systems,
portable systems,
automotive applications, and
green house lighting systems.

\* \* \* \* \*